United States Patent
Hajati et al.

(10) Patent No.: US 9,375,850 B2
(45) Date of Patent: Jun. 28, 2016

(54) MICROMACHINED ULTRASONIC TRANSDUCER DEVICES WITH METAL-SEMICONDUCTOR CONTACT FOR REDUCED CAPACITIVE CROSS-TALK

(71) Applicants: Arman Hajati, Santa Clara, CA (US); Dimitre Latev, San Jose, CA (US); Deane Gardner, Cupertino, CA (US); Hung-Fai Stephen Law, Los Altos, CA (US)

(72) Inventors: Arman Hajati, Santa Clara, CA (US); Dimitre Latev, San Jose, CA (US); Deane Gardner, Cupertino, CA (US); Hung-Fai Stephen Law, Los Altos, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 449 days.

(21) Appl. No.: 13/762,037

(22) Filed: Feb. 7, 2013

(65) Prior Publication Data
US 2014/0219063 A1    Aug. 7, 2014

(51) Int. Cl.
*B06B 1/06* (2006.01)
*B25J 15/12* (2006.01)
*H01L 27/20* (2006.01)
*B25J 9/10* (2006.01)
*B25J 15/00* (2006.01)
*B06B 1/02* (2006.01)
*H01L 41/09* (2006.01)

(52) U.S. Cl.
CPC ............... *B25J 15/12* (2013.01); *B06B 1/0292* (2013.01); *B06B 1/0622* (2013.01); *B25J 9/104* (2013.01); *B25J 15/0009* (2013.01); *H01L 27/20* (2013.01); *H01L 41/098* (2013.01); *Y10S 901/29* (2013.01)

(58) Field of Classification Search
USPC ............................................... 367/157
See application file for complete search history.

(56) References Cited

U.S. PATENT DOCUMENTS

| | | | |
|---|---|---|---|
| 6,262,946 B1 * | 7/2001 | Khuri-Yakub et al. | 367/181 |
| 6,430,109 B1 | 8/2002 | Khuri-Yakub et al. | |
| 6,443,901 B1 * | 9/2002 | Fraser | 600/459 |
| 6,918,877 B2 * | 7/2005 | Hossack et al. | 600/447 |
| 7,545,075 B2 * | 6/2009 | Huang et al. | 310/309 |
| 7,741,686 B2 * | 6/2010 | Khuri-Yakub et al. | 257/416 |
| 7,745,973 B2 * | 6/2010 | Bayram et al. | 310/328 |
| 7,750,537 B2 * | 7/2010 | Hossack et al. | 310/334 |
| 7,982,362 B2 * | 7/2011 | Adachi et al. | 310/309 |
| 8,456,958 B2 * | 6/2013 | Felix et al. | 367/181 |
| 8,563,345 B2 * | 10/2013 | Adler et al. | 438/50 |
| 2005/0200241 A1 * | 9/2005 | Degertekin | 310/334 |
| 2007/0167814 A1 * | 7/2007 | Wakabayashi | A61B 8/12 600/459 |
| 2007/0193354 A1 | 8/2007 | Felix et al. | |
| 2007/0228878 A1 * | 10/2007 | Huang | 310/322 |

(Continued)

OTHER PUBLICATIONS

"International Search Report and Written Opinion of the International Searching Authority for International Application No. PCT/US2014/013862", (May 16, 2014), Whole Document.

(Continued)

*Primary Examiner* — James Hulka
(74) *Attorney, Agent, or Firm* — Blakely, Sokoloff, Taylor & Zafman LLP

(57) ABSTRACT

Embodiments reduce capacitive cross-talk between micromachined ultrasonic transducer (MUT) arrays through grounding of the substrate over which the arrays are fabricated. In embodiments, a metal-semiconductor contact is formed to a semiconductor device layer of a substrate and coupled to a ground plane common to a first electrode of the transducer elements to suppress capacitive coupling of signal lines connected to a second electrode of the transducer elements.

22 Claims, 8 Drawing Sheets

(56) References Cited

U.S. PATENT DOCUMENTS

| | | | |
|---|---|---|---|
| 2008/0048211 A1* | 2/2008 | Khuri-Yakub et al. | 257/204 |
| 2008/0089181 A1* | 4/2008 | Adachi | A61B 8/12 367/189 |
| 2008/0259725 A1 | 10/2008 | Bayram et al. | |
| 2009/0048519 A1 | 2/2009 | Hossack et al. | |
| 2009/0152980 A1* | 6/2009 | Huang | 310/309 |
| 2010/0201222 A1 | 8/2010 | Adachi et al. | |
| 2010/0255623 A1* | 10/2010 | Huang | 438/51 |
| 2010/0280388 A1* | 11/2010 | Huang | 600/459 |
| 2012/0187508 A1 | 7/2012 | Adler et al. | |

OTHER PUBLICATIONS

International Preliminary Report on Patentability for International Application No. PCT/US2014/013862 mailed Aug. 20, 2015, 10 pgs.

* cited by examiner

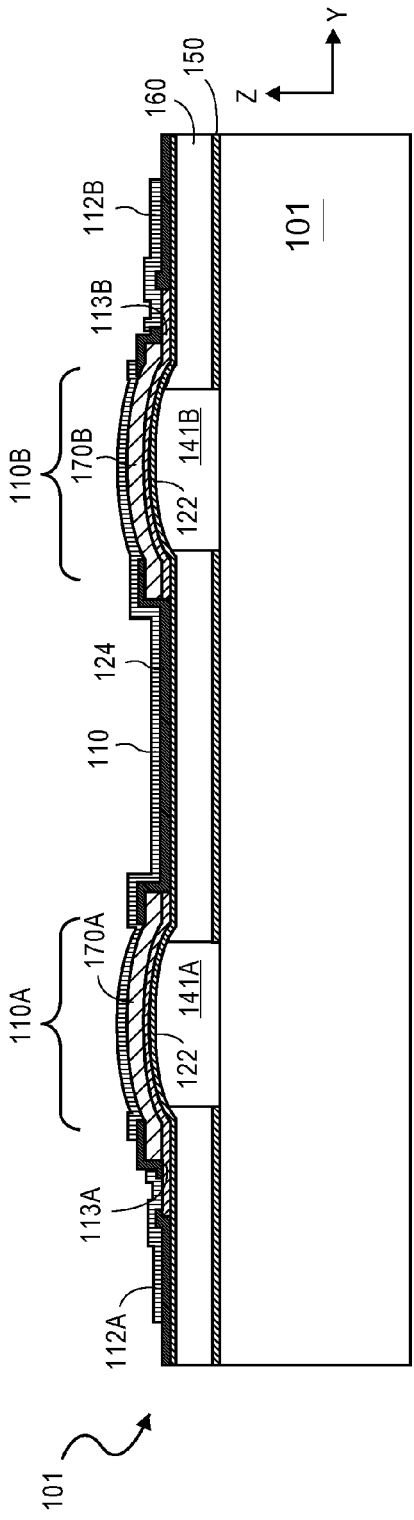
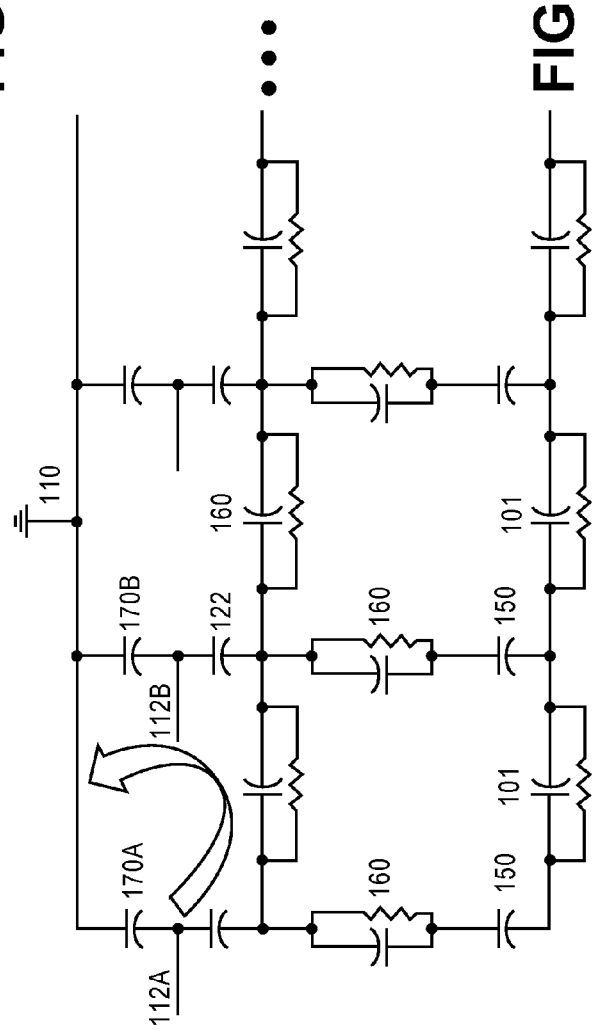

MICROMACHINED ULTRASONIC TRANSDUCER DEVICES WITH METAL-SEMICONDUCTOR CONTACT FOR REDUCED CAPACITIVE CROSS-TALK

TECHNICAL FIELD

Embodiments of the invention generally relate to micromachined ultrasonic transducer (MUT) arrays, and more specifically pertain to reducing capacitive cross-talk between transducer elements of an array.

BACKGROUND

An ultrasonic transducer device typically includes a membrane capable of vibrating in response to a time-varying driving voltage to generate a high frequency pressure wave in a propagation medium (e.g., air, water, or body tissue) in contact with an exposed outer surface of the transducer element. This high frequency pressure wave can propagate into other media. The same piezoelectric membrane can also receive reflected pressure waves from the propagation media and convert the received pressure waves into electrical signals. The electrical signals can be processed in conjunction with the driving voltage signals to obtain information on variations of density or elastic modulus in the propagation media.

Ultrasonic transducer devices can be advantageously fabricated inexpensively to exceedingly high dimensional tolerances using various micromachining techniques (e.g., material deposition, lithographic patterning, feature formation by etching, etc.). As such, large arrays of transducer elements are employed with individual ones of the arrays driven via beam forming algorithms. Such arrayed devices are known as micromachined ultrasonic transducer (MUT) arrays and may utilized capacitive transducers (cMUTs) or piezoelectric transducers (pMUTs), for example.

Cross-talk between transducer elements can cause significant performance degradation of a MUT array and should therefore be minimized. One source of cross-talk is capacitive coupling. Such capacitive coupling may occur between signal lines of separate transducer channels within the array. MUT array architectures and structures that reduce such capacitive coupling are therefore advantageous.

BRIEF DESCRIPTION OF THE DRAWINGS

Embodiments of the present invention are illustrated by way of example, and not limitation, in the figures of the accompanying drawings in which:

FIG. 1A illustrates a cross-sectional view of two adjacent pMUT elements that may be utilized to form a pMUT array;

FIG. 1B illustrates an electrical model of components present in a pMUT array employing the architecture illustrated in FIG. 1A;

DETAILED DESCRIPTION

Figure 2A:
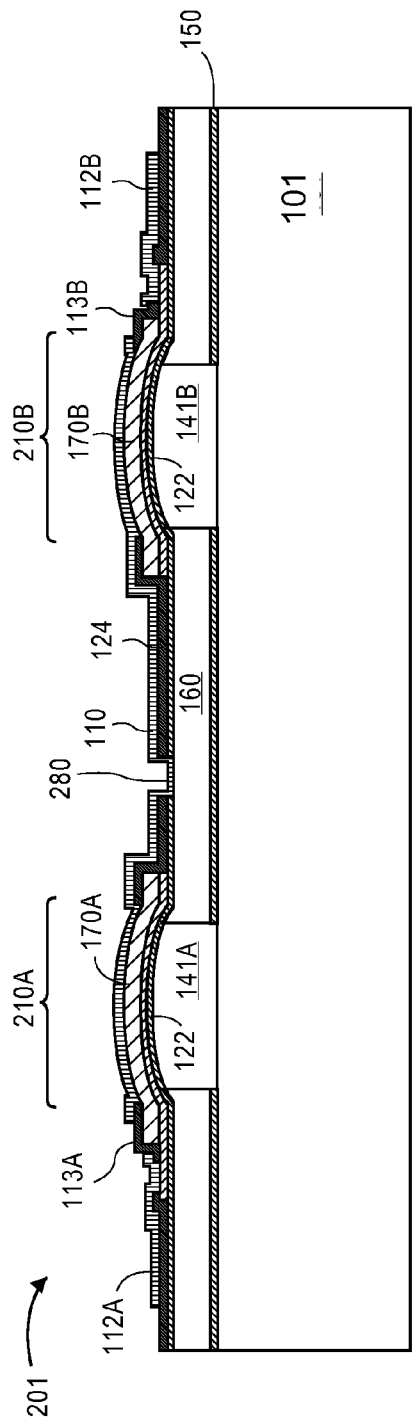
FIG. 2A illustrates a cross-sectional view of two adjacent pMUT elements that may be utilized to form an array with reduced capacitive cross-talk between transducer elements, in accordance with an embodiment of the invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specifically denoted as being mutually exclusive.

The term "coupled" is used herein to describe functional or structural relationships between components. "Coupled" may be used to indicate that two or more elements are in either direct or indirect (with other intervening elements between them or through the medium) mechanical, acoustic, optical, or electrical contact with each other, and/or that the two or more elements co-operate or interact with each other (e.g., as in a cause and effect relationship).

The terms "over," "under," "between," and "on" as used herein refer to a relative position of one component or material layer with respect to other components or layers where such physical relationships are noteworthy for mechanical components in the context of an assembly, or in the context of material layers of a micromachined stack. One layer (component) disposed over or under another layer (component) may be directly in contact with the other layer (component) or may have one or more intervening layers (components). Moreover, one layer (component) disposed between two layers (components) may be directly in contact with the two layers (components) or may have one or more intervening layers (components). In contrast, a first layer (component) "on" a second layer (component) is in direct contact with that second layer (component).

Embodiments described herein suppress capacitive cross-talk between transducer elements in a MUT array by introducing a metal-semiconductor contact and interconnecting that contact to a reference potential plane (e.g., ground plane)

common to the transducer elements. With the metal-semiconductor contact tying a semiconductor device layer of the substrate to the reference potential plane through a path of sufficiently low resistance, capacitive coupling between signal lines via the substrate semiconductor can be suppressed, markedly reducing transducer element cross-talk.

FIG. 1A illustrates a cross-sectional view of two adjacent piezoelectric pMUT elements 110A and 110B that may be utilized to form a pMUT array 101. The pMUT elements 110A and 110B each represent one transducer element in two separate channels (i.e., electrically addressable independently from each other) of a transducer array. In this example, the separate channels correspond to rows of the array, however a channel may take alternative forms within an array (e.g., concentric rings of transducers, etc.). Although the illustrated embodiment utilizes piezoelectric transducer elements, embodiments utilizing other transducer elements, such as, but not limited to capacitive elements, are also possible although a detailed description is omitted herein for clarity.

As shown in FIG. 1A, the pMUT elements 110A and 110B are disposed over an area of a substrate. Generally, the substrate may be any known in the art as amenable to microelectronic/micromachining processing, such as, but not limited to semiconductor wafers. In the exemplary embodiment depicted in FIG. 1A, the substrate is a semiconductor-on-insulator (SOI) substrate including a semiconductor substrate layer 160 (e.g., crystalline silicon, silicon-germanium, or germanium) disposed over an insulator layer 150 (e.g., silicon dioxide), and a handling substrate 103 (e.g., bulk crystalline semiconductor, such as silicon).

Spanning voids 141A and 141B formed in the semiconductor substrate layer 160 are discrete piezoelectric membranes 170A and 170B, respectively. In the exemplary embodiment, the piezoelectric membranes 170A and 170B are Lead Zirconate Titanate (PZT), although any piezoelectric material known in the art to be amenable to conventional micromachine processing may also be utilized, such as, but not limited to polyvinylidene difluoride (PVDF) polymer particles, BaTiO3, single crystal PMN-PT, and aluminum nitride (AlN). Disposed in direct contact with a bottom surface of the piezoelectric membranes 170A and 170B are bottom electrodes 113A, 113B, respectively. The bottom electrodes 113A, 113B are a thin film layer of conductive material (e.g., deposited by PVD, ALD, CVD, etc.) that is compatible (e.g., thermally stable, has good adhesion, low stress) with the piezoelectric membrane material, such as, but not limited to, one or more of Au, Pt, Ni, Ir, Sn, etc., alloys thereof (e.g., AuSn, IrTiW, AuTiW, AuNi, etc.), oxides thereof (e.g., $IrO_2$, $NiO_2$, $PtO_2$, indium tin oxide (ITO), etc.), or composite stacks of two or more such materials. Electrically connected to the bottom electrodes 113A, 113B are interconnects 112A, 112B, respectively. The interconnects 112A, 112B are a thin film layer of conductive material (e.g., deposited by PVD, ALD, CVD, etc.) of any conventional composition capable of providing a low resistance and amenable to patterning, such as, but not limited to, Au, Al, W, or Cu.

As further depicted in FIG. 1A, the bottom electrodes 113A, 113B are disposed on a thin film dielectric layer 122, such as silicon dioxide, that can serve as a support, etch stop during fabrication, electrical insulator, and/or diffusion barrier. A second thin film dielectric layer (e.g., silicon dioxide) 124 is further disposed over portions of the piezoelectric membranes 170A, 170B and disposed over the semiconductor substrate layer 160 in regions between the membranes 170A, 170B. The dielectric layer 124 insulates the bottom electrodes 113A, 113B from respective top electrode metallization 110. As shown, the top electrode metallization 110 is disposed in direct contact with a top surface of the piezoelectric membranes 170A and 170B and serves to connect a terminal of both the elements 110A and 110B to a common reference plane potential (e.g., ground) plane. In this exemplary embodiment, the top electrode metallization 110 is employed as the reference (ground) plane to shield the transducer elements 110A, 110B from electro-magnetic interference and the surface electrical charge in the ambient environment during operation. As such, the bottom electrodes 113A, 113B and interconnects 112A, 112B are employed as drive/sense signal terminals. With this architecture however, the signal terminals can form a parasitic capacitance to the semiconductor substrate layer 160 through dielectric layer 122, as further modeled by the electric circuit depicted in FIG. 1B where the circuit elements are labeled with reference numbers corresponding to the physical structures referenced in FIG. 1A.

As shown in FIG. 1B, the various thin films depicted in FIG. 1A facilitate a parasitic capacitive coupling between the transducer elements 110A and 110B. The arrow illustrated in FIG. 1B is a parasitic loop having an associated impedance that varies with the operating frequency of the array 101 (e.g., 100 kHz-1 GHz, depending on the ultrasound application). The parasitic loop couples a first signal terminal (e.g., interconnect 112A/bottom electrode 113A) to a second signal terminal (e.g., interconnect 112B/bottom electrode 113B) through the dielectric layer 122 to the semiconductor substrate layer 160. Capacitive coupling to the metallization 110 (e.g., via capacitive coupling through the piezoelectric membranes 170A, 170B) completes the parasitic loop.

In embodiments, a MUT array includes a metal-semiconductor contact coupled to a semiconductor layer of the substrate to reduce capacitive cross-talk between transducer elements. FIG. 2A illustrates a cross-sectional view of two adjacent pMUT elements 210A, 210B that are utilized in two separate channels of a pMUT array 201 with reduced capacitive cross-talk between transducer elements, in accordance with an embodiment of the invention. Reference numbers in FIG. 2A are carried over from those in FIG. 1A for like features with attributes/characteristics of those features being as described in the context of FIG. 1A.

Figure 2B:
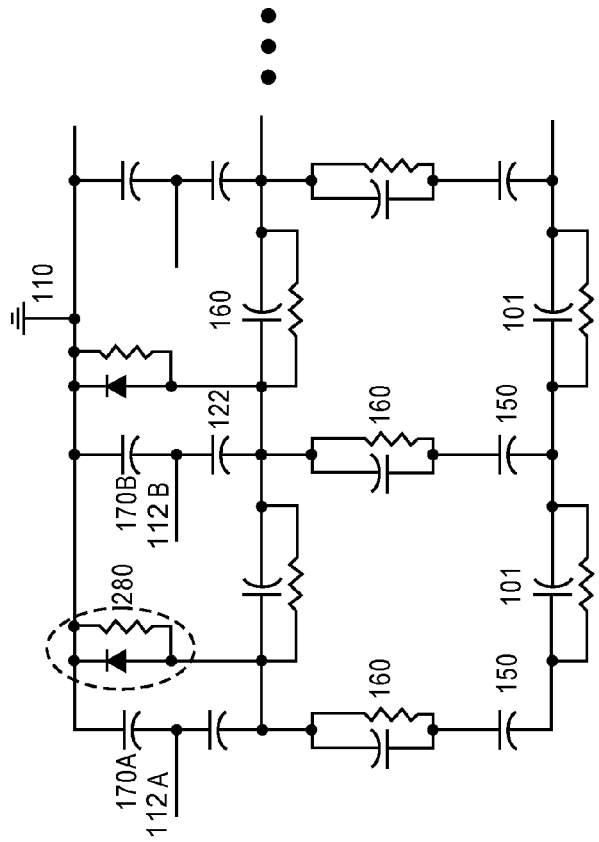
FIG. 2B illustrates an electrical model of components present in a pMUT array employing the architecture illustrated in FIG. 2A, in accordance with an embodiment of the invention.

As shown in FIG. 2A, a metal-semiconductor contact 280 is formed to the device semiconductor substrate layer 160. The metal-semiconductor contact 280 is further connected to the reference (ground) plane provided by the metallization 110, tying the semiconductor substrate layer 160 to the same reference potential as one of the electrodes in each of the transducer elements 210A, 210B. FIG. 2B illustrates an electrical model of components present in the pMUT array 201 with the reference numbers in FIG. 2B serving to denote a corresponding structural element depicted in FIG. 2A. As shown, the parasitic loop present in FIG. 1B is shunted by the metal-semiconductor contact 280 modeled as a diode in parallel with a resistor corresponding to rectifying (Schottky) or ohmic character of the metal-semiconductor contact 280. To suppress (reduce) capacitive coupling of transducers in separate channels, the semiconductor substrate layer 160 (e.g., silicon) is tied to ground with embodiments achieving a more silent ground where the impedance of the ground line is significantly smaller than the impedance of the parasitic loop being shunted (which decreases with high operating frequency). Such embodiments connect the semiconductor substrate layer 160 to the reference plane by a small resistive path with metal-semiconductor contact 280 being advantageously ohmic and of a low resistance. In embodiments, the metal-semiconductor contact 280 includes a metal in direct contact with the semiconductor substrate layer 160 that has a similar work function as the semiconductor substrate layer 160 (e.g., less than 0.3 eV difference). As the semiconductor substrate layer 160 may be doped either p-type or n-type to various levels, the contact metal composition may vary (e.g., a p-metal or an n-metal). In embodiments where the semiconductor substrate layer 160 is highly doped (e.g., 1e19-1e20 cm-3 with dopant species, such as, but not limited to, boron or phosphorus), a tunneling contact junction can be formed.

Figure 2C:
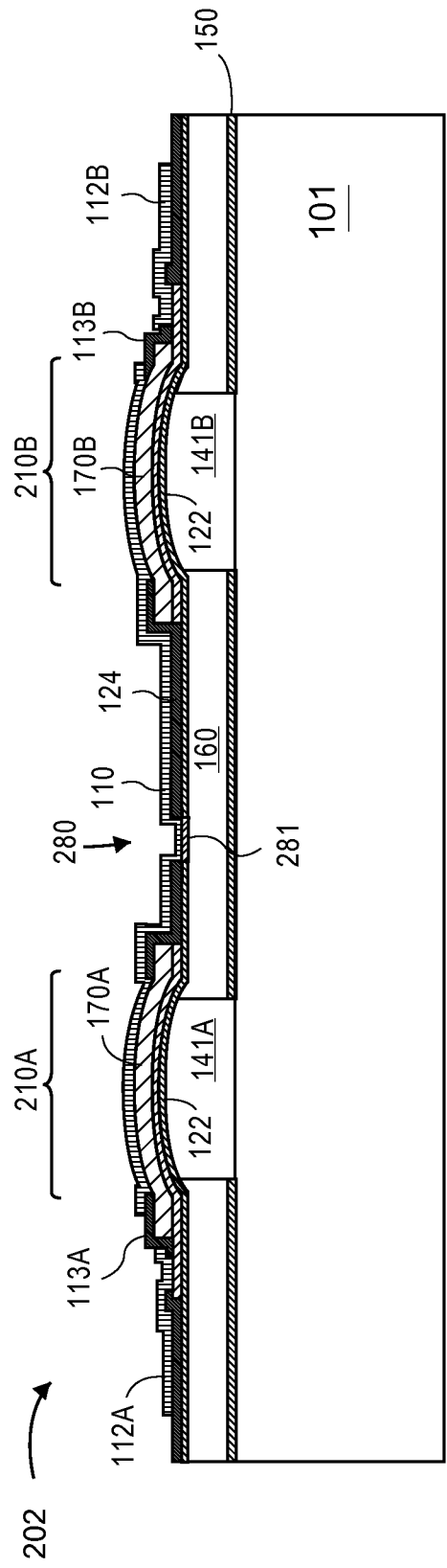
FIG. 2C illustrates a cross-sectional view of two adjacent pMUT elements that may be utilized to form an array with reduced capacitive cross-talk between transducer elements, in accordance with a silicide contact embodiment of the invention.

In still other embodiments, the semiconductor substrate layer 160, whether n-type or p-type, may be reacted with certain contact metals, for example to form a silicide on the semiconductor substrate layer 160. Silicide contacts, with their stability and low resistance ohmic properties for both n-type and p-type conductivities over a wide range of impurity concentrations, are advantageous for reducing capacitive cross-talk in MUT arrays. FIG. 2C illustrates a cross-sectional view of two adjacent pMUT elements that may be utilized to form an array 202 with reduced capacitive cross-talk between transducer elements, in accordance with a silicide contact embodiment of the invention. As shown, a metal silicide contact 281 is disposed between the semiconductor substrate layer 160 and an overlying metallization 210 that interconnects the metal silicide 281 to a pMUT terminal (e.g., ground terminal). The metal silicide contact 281 generally comprises a metal that is reactive with silicon present in the semiconductor substrate layer 160 (e.g., a silicon substrate). In certain such embodiments, the ohmic metal silicide contact 281 includes a metal, such as, but not limited to, Pt, Ti, Ni, Al, Mo, Co, W Notably, the metal employed in the metal-semiconductor contact 280 may not be a suitable interface to the material utilized in the piezoelectric membranes 170A, 170B. For example, certain metals do not form an interface with piezoelectric material that remains stable at a sufficiently high temperature to accommodate subsequent fabrication processes. Thus, although a single material, such as ITO, may be suitable for both contacting the semiconductor layer and as an electrode interface with the piezoelectric material in certain embodiments, other embodiments employ material stacks where the piezoelectric compatible material is disposed over the metal-semiconductor contact metal. For example, in one embodiment where at least one of $IrO_2$, $NiO_2$, $PtO_2$, and indium tin oxide (ITO) is disposed directly on the piezoelectric membranes 170A, 170B, that conductive material is further disposed over the ohmic contact metal (e.g., Pt, Ti, Al/Cu) utilized in the metal-semiconductor contact 280 with an optional adhesion layer (e.g., Ti) disposed there between.

In the exemplary embodiment illustrated in FIG. 2A, the metallization 110 employed to connect the two transducer elements 210A and 210B to the reference plane is further employed for connecting the semiconductor substrate layer 160 to the reference plane through the metal-semiconductor contact 280. For such an embodiment, the stack of metals present at the contact 280 may further comprise a bulk metal layer for the purpose of reducing resistivity of the interconnect. One or more adhesion layers and/or diffusion barrier layer may also be present in the metal stack comprising the contact 280. For example, a layer of Au may be disposed over the ohmic metal and the piezoelectric interface metal with a Ti layer disposed there between for a Pt/Ti/IrO2/Ti/Au stack disposed over the semiconductor substrate layer 160. Alternatively, where a same metal is disposed on the piezoelectric membranes 170A, 170B and the semiconductor substrate layer 160, the metal stack at the contact 280 may be ITO/Ti/ Au. While these exemplary embodiments have been found to have advantageous characteristics, other metallizations are also possible.

While the resistance of an ohmic metal-semiconductor contact is to be less than an impedance of the parasitic capacitive loop, the resistive path to the reference potential is also a function of the resistance of the semiconductor substrate layer 160 with higher semiconductor resistance increasing the ground shunt resistance. A doped semiconductor substrate layer 160 of lower resistance is therefore advantageous and/or a greater number of metal-semiconductor contacts may be employed to reduce the effect of semiconductor resistance.

FIGS. 3A-3F illustrate plan views of MUT arrays with reduced capacitive cross-talk between elements, further illustrating placement of metal-semiconductor contacts connecting a semiconductor layer to the reference (ground) plane in accordance with embodiments of the invention.

Figure 3A:
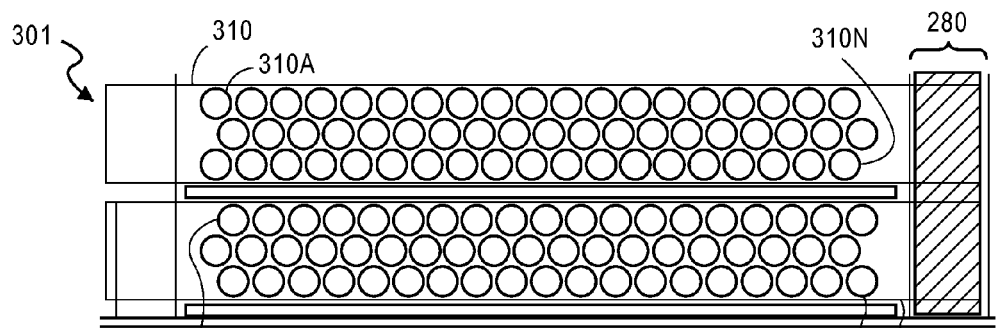
FIGS. 3A, 3B, 3C, 3D, 3E, and 3F illustrate plan views of MUT arrays with reduced capacitive cross-talk between elements, in accordance with embodiments of the invention.

FIG. 3A illustrates a MUT array 301 which may be a pMUT array in which one of the transducer elements 310A-310N for a first channel 310 and one of the transducer elements 320A-320N for a second channel 320 are represented by the FIG. 2A. For each of the channels 310, 320 there are a plurality of transducer elements 310A-310N and 320A-320N arranged into three rows. The metal-semiconductor contact 280 is disposed at one end of the rows. For such embodiments with a single contact, active die area is preserved for a higher transducer element fill factor, however the semiconductor layer resistance should in such embodiments be made low through impurity doping with an adequate dopant species concentration being dependent on the length of the rows (y-dimension of channels 310, 320), which may exceed a few millimeters. Area of the contact 280 should also be sufficient to ensure contact resistance is below the parasitic impedance. As shown, the metal-semiconductor contact 280 has a width (x-dimension) at least as great as that of the channels 310, 320 and a length greater than that of two transducer elements for an area more than twice the area of one transducer membrane.

Figure 3B:
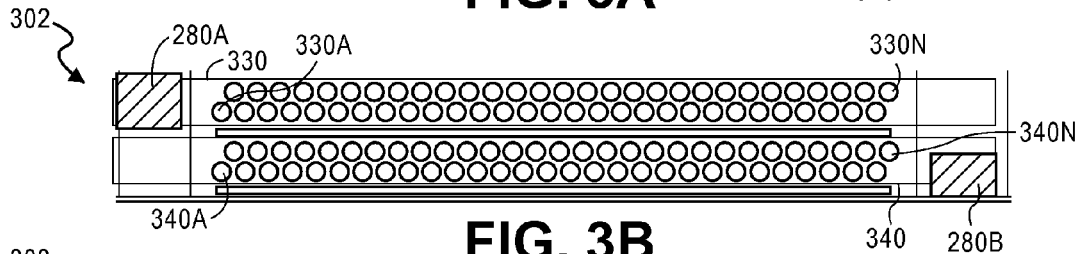
Figure 3C:
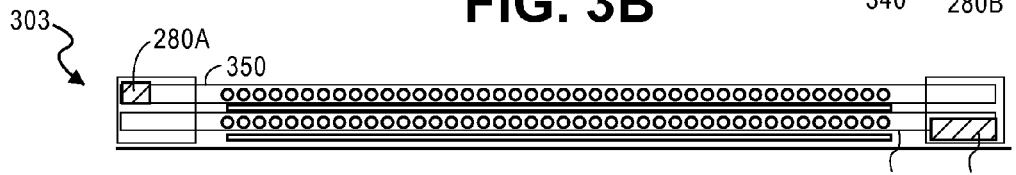

FIG. 3B illustrates a MUT array 302 with separate channels 330 and 340 each having transducer elements (330A-330N and 340A-340N) arranged into two rows. For this embodiment, metal-semiconductor contacts 280A and 280B are disposed at opposite ends of the rows for the two adjacent channels 330, 340. This architecture reduces the lengths over which the semiconductor substrate layer 160 provides the path to the reference (ground) plane and may therefore reduce the conductivity requirements of the semiconductor substrate layer 160 correspondingly. As further shown in FIG. 3C, where the array channels 350, 360 each comprise single rows of elements, the metal-semiconductor contacts 280A, 280B are scaled (e.g., to permit access to signal line contacts) in the width dimension with the length dimension maintaining a sufficient area for low contact resistance (e.g., greater than twice the area of transducer membrane). Notably, the arrays 301, 302, and 303 may be combined onto a single transducer device chip as part of a larger array such that the various metal-semiconductor contact embodiments illustrated in FIGS. 3A-3C may all be present within a single substrate.

Figure 3D:
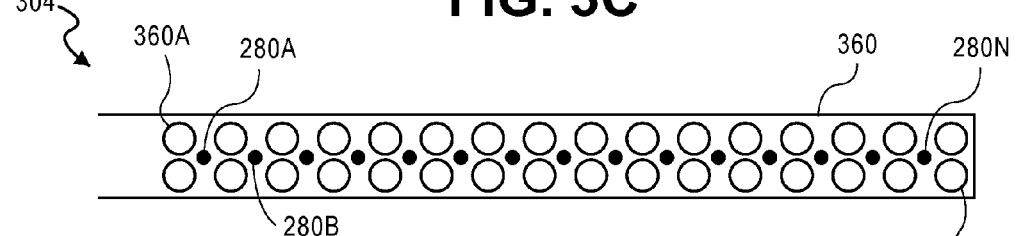
Figure 3E:
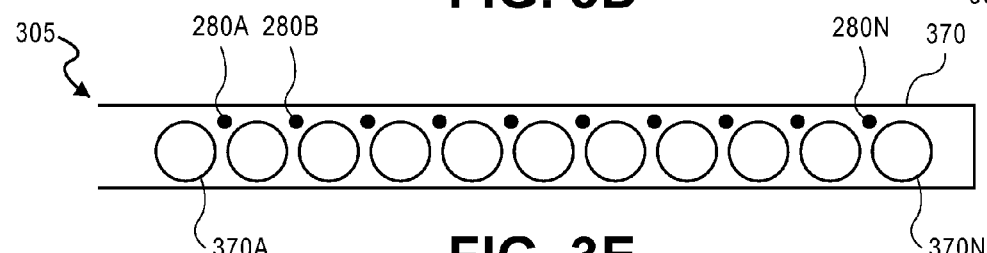
Figure 3F:
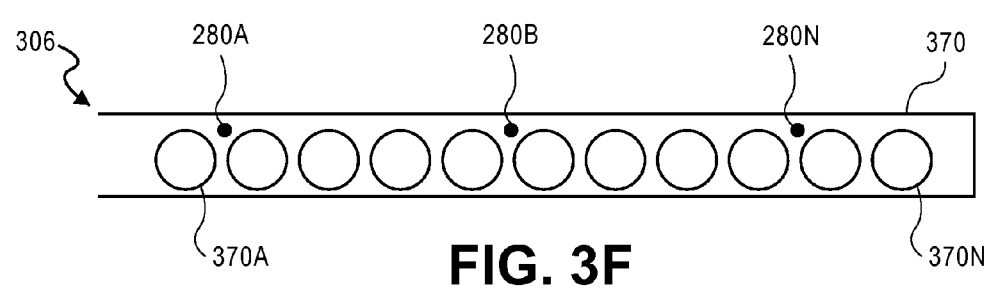

In certain embodiments, the metal-semiconductor contact 280 is provided adjacent to every transducer element of a given channel, as further illustrated in FIGS. 3D and 3E. While such embodiments provide excellent crosstalk suppression that is far less dependent of electrical conductivity of the semiconductor substrate layer 160, a significant portion of substrate area may be sacrificed. For FIG. 3D, the array 304 includes a channel 360 with transducer elements 360A-360N arranged into two rows with the metal-semiconductor contacts 280A, 280B, 280N forming a plurality of intervening contacts between the reference (ground) plane and the underlying semiconductor substrate layer 160. FIG. 3E illustrates another embodiment where an array 305 has a channel 370 with a single row of transducer elements 370A-370N and the metal-semiconductor contacts 280A-280N aligned as an adjacent row. Notably, the number of metal-semiconductor contacts may vary widely depending on factors including the sensitivity of the array to parasitic loops. As such, the metal-semiconductor contact 280 need not be disposed adjacent to every transducer element of a given channel, and instead may be arranged to have one contact for each set of transducer elements including more than one element. For example, in the array 306 illustrated by FIG. 3F, a set of four elements 370 are disposed between each of the metal-semiconductor contacts 280A, 280B, 280N.

Figure 4A:
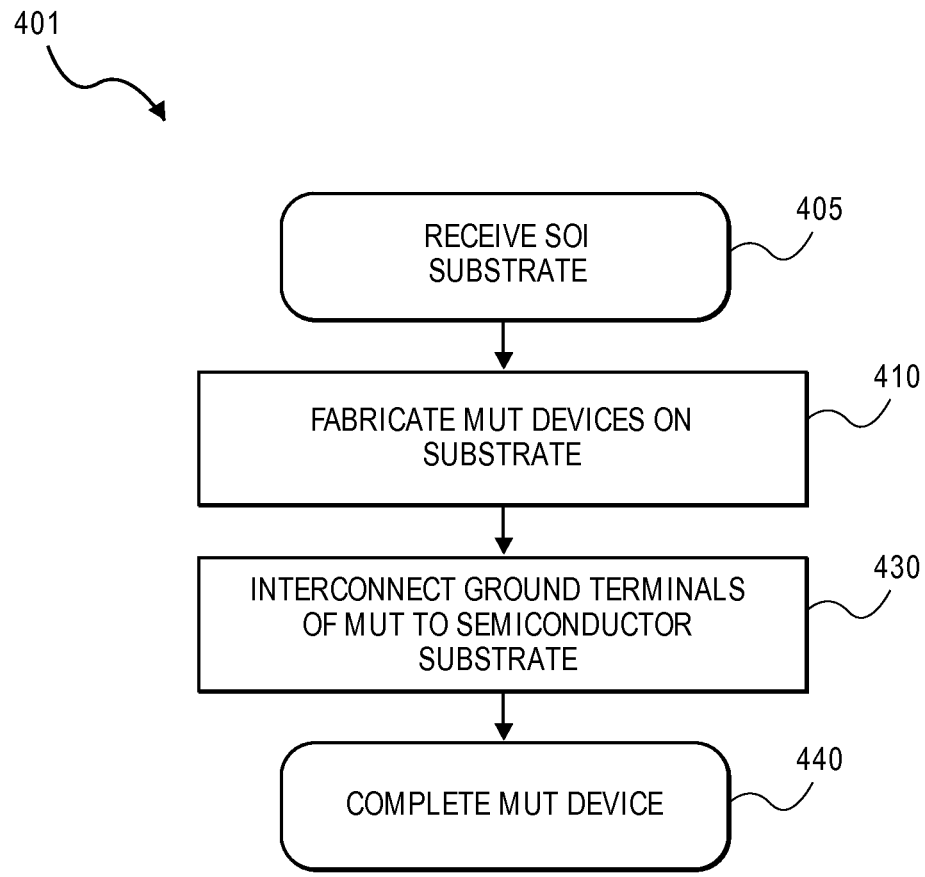
FIG. 4A is a flow diagram of a method to fabricate a MUT array with reduced capacitive cross-talk between transducer elements, in accordance with embodiments of the invention.

FIG. 4A is a flow diagram of a method 401 to fabricate a MUT array with reduce capacitive cross-talk between transducer elements, in accordance with embodiments of the invention. The method 401 begins with receiving a substrate, such as the SOI substrate illustrated in FIGS. 1A and 2A. A top semiconductor layer of the substrate, such as a silicon layer of an SOI substrate, may be impurity doped to a desired resistivity. At operation 410, arrays of discrete ultrasonic transducer elements, such as those illustrated in FIGS. 1A, 2A, and 3A-3E are fabricated using any conventional techniques (e.g., CVD or PVD depositions, lithographic patterning, dry and wet etching, etc.). In one pMUT embodiment, for example, a piezoelectric material layer, such as PZT, is deposited with a bottom surface of the piezoelectric material layer in contact with a first electrode. At operation 430, the discrete transducer membranes are interconnected with metallization to connect first terminals of each transducer element to a common reference (ground) plane and to further connect at least the top semiconductor layer of the substrate to the reference (ground) plane. Next, at operation 440 the MUT device is completed with conventional processing, such as, but not limited to deposition of a passivation dielectric and/or patterning of additional metallization to further interconnect elements of one or more arrays.

Figure 4B:
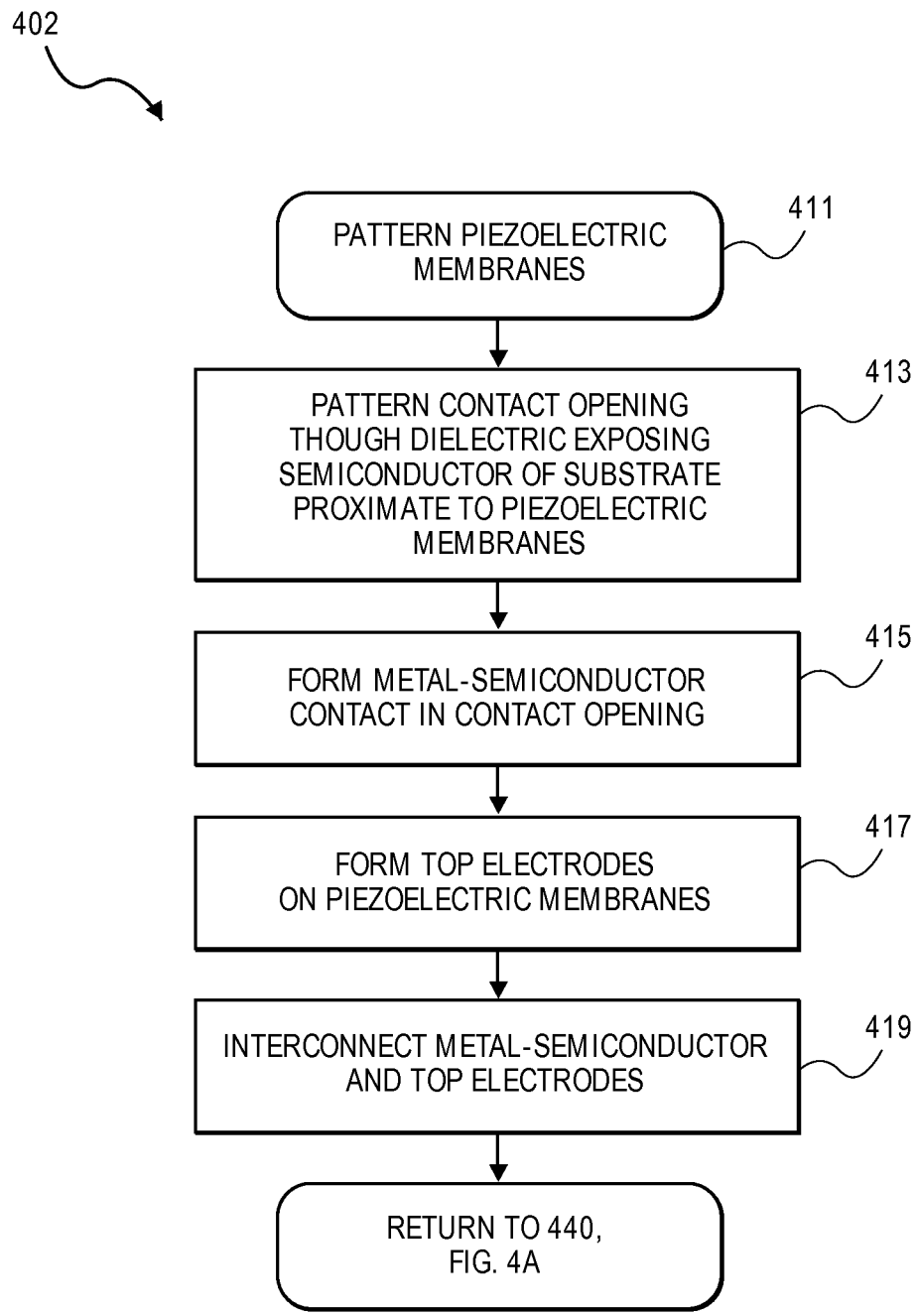
FIG. 4B is a flow diagram of a method to fabricate a pMUT array with reduce capacitive cross-talk between transducer elements in a pMUT, in accordance with embodiments of the invention.

FIG. 4B is a flow diagram of a method 402 further describing techniques to fabricate a pMUT array with reduced capacitive cross-talk between transducer elements, in accordance with embodiments of the invention. The method 401 may generally be performed as part of the method 401. The method 402 begins with patterning a piezoelectric film, such as PZT, into discrete membranes at operation 411, for example into rows of elements. At operation 413, a contact opening is defined through a dielectric layer disposed over the top semiconductor layer of the substrate (e.g., dielectric layers 122 and/or 124 shown in FIGS. 1A, 2A) to expose the semiconductor layer (e.g., semiconductor substrate layer 160 in FIGS. 1A, 2A). Any conventional lithographic masking, patterning, and thin film etching may be utilized at operation 413. Depending on the embodiment (e.g., as a function of semiconductor layer resistivity), operation 413 may entail opening a plurality of regions in the dielectric along a length of a row of membrane elements or opening a single region of the dielectric disposed at an end or middle of a row.

At operation 415, a metal-semiconductor contact is formed in the contact opening for example by depositing an ohmic metal in the contact opening. As used herein, an "ohmic metal" is any metal that forms a non-rectifying contact with the semiconductor layer. In certain embodiments, operation 415 further entails a silicidation process, which may be self-aligned to the metal-semiconductor contact openings with unreacted metal deposited at operation 415 stripped off selectively to the silicided regions. At operation 417, a top piezoelectric electrode metal is deposited (e.g., by PVD) onto the piezoelectric elements and also over the ohmic metal present in the metal-semiconductor contacts. For example, any of one or more of $IrO_2$, $NiO_2$, $PtO_2$, and ITO may be deposited at operation 417. At operation 419 the metallization deposited at operation 417 is then patterned to delineate conductive interconnects coupling one terminal of the piezoelectric membranes and the metal-semiconductor contacts to a same reference (ground) plane. The method 402 then returns to operation 440 of the method 401 for completion of the pMUT device.

Figure 4C:
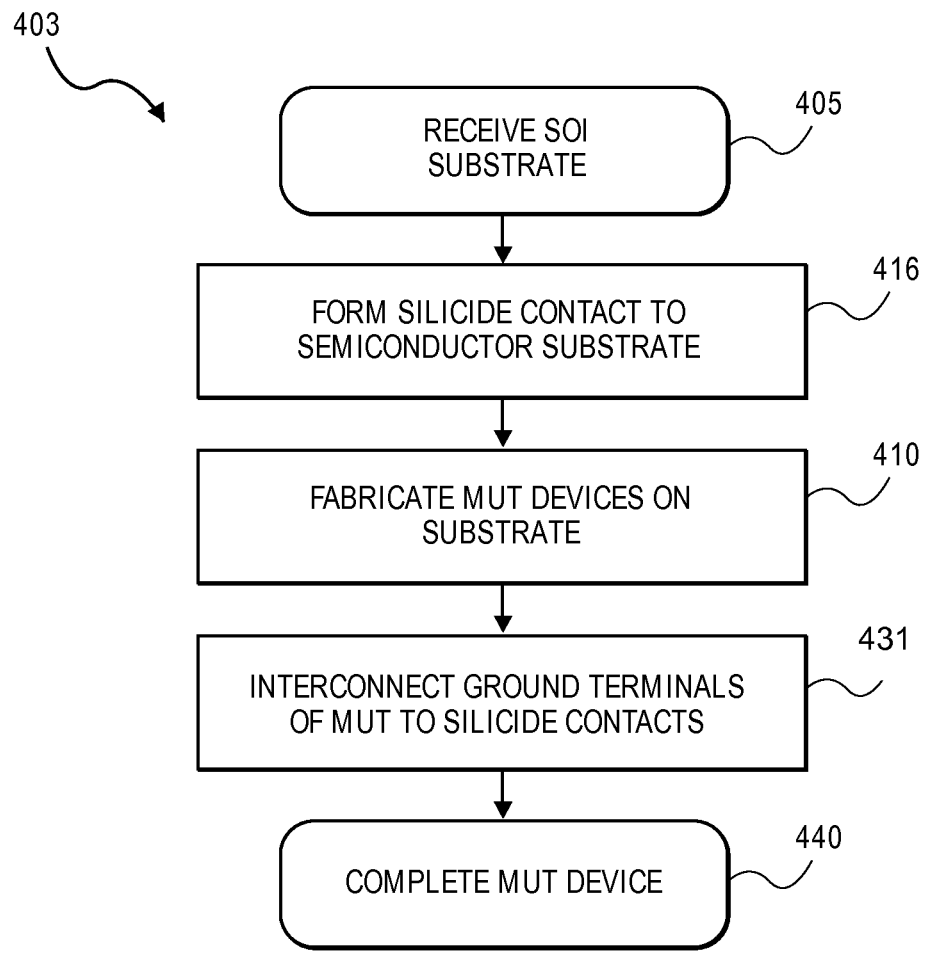
FIG. 4C is a flow diagram of a method to fabricate a pMUT array with reduced capacitive cross-talk between transducer elements in a pMUT, in accordance with additional embodiments of the invention.

Noting the formation of ohmic contacts that include a silicide may require high processing temperatures, in embodiments the ohmic metal-semiconductor contacts are in certain embodiments formed prior to the fabrication of MUT devices. FIG. 4C is a flow diagram of a method 403 to fabricate a pMUT array with reduce capacitive cross-talk between transducer elements in a pMUT, in accordance with a particular silicide contact embodiments. The method 403 begins with receiving the SOI substrate at operation 405. The silicide contact is then formed at operation 416, which may for example further entail a patterning of a dielectric to expose a silicon semiconductor substrate, deposition of a reactive metallization, a high temperature thermal treatment facilitating reaction between the reactive metallization and the exposed silicon. As another option, un-reacted metallization may be stripped, for example with a wet etch/treatment. Subsequent to the silicide contact operation 416, the MUT (e.g., PMUT) devices are fabricated over the substrate at operation 410, for example using one or more of the techniques described elsewhere herein or, alternatively, any conventional techniques. At operation 431, terminals (e.g., ground terminals) of the MUT devices are then interconnected to the silicide contact(s). For example, one or more metallization layer may be deposited onto the silicide contact(s) and appropriate MUT structures. Conventional patterning techniques are then utilized to complete element interconnection to the ohmic contact(s). The method 403 then ends at operation 440 with completion of the MUT devices following any conventional practice.

Figure 5:
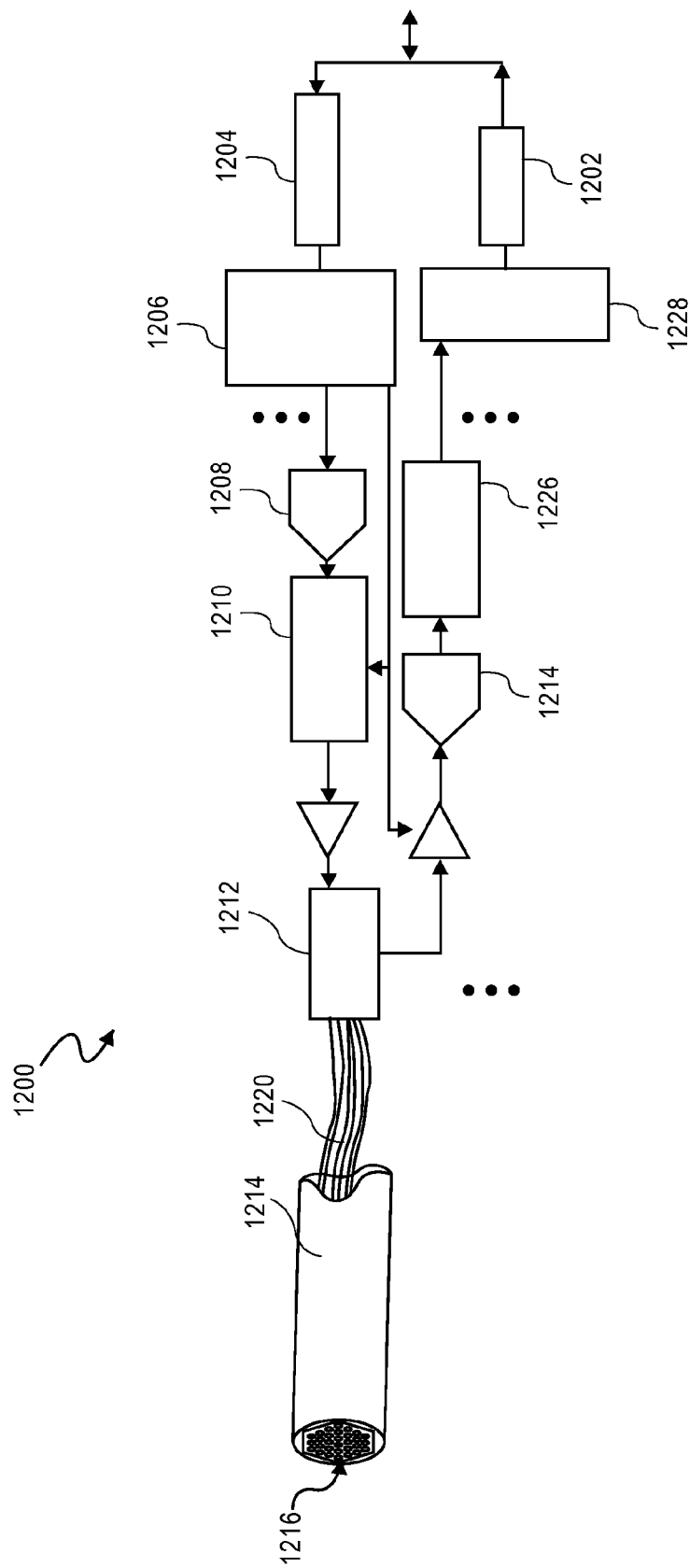
FIG. 5 is a functional block diagram of an ultrasonic transducer apparatus that employs a pMUT array having reduced capacitive cross-talk, in accordance with an embodiment of the present invention.

FIG. 5 is a functional block diagram of an ultrasonic transducer apparatus 1200 that employs a pMUT array having reduced capacitive cross-talk, in accordance with an embodiment of the present invention. In an exemplary embodiment, the ultrasonic transducer apparatus 1200 is for generating and sensing pressure waves in a medium, such as water, tissue matter, etc. The ultrasonic transducer apparatus 1200 has many applications in which imaging of internal structural variations within a medium or multiple media is of interest, such as in medical diagnostics, product defect detection, etc. The apparatus 1200 includes at least one pMUT array 1216, which may be any of the pMUT arrays described elsewhere herein having any of the transducer element and element population attributes described. In exemplary embodiment, the pMUT array 1216 is housed in a handle portion 1214 which may be manipulated by machine or by a user of the apparatus 1200 to change the facing direction and location of the outer surface of the pMUT array 1216 as desired (e.g., facing the area(s) to be imaged). Electrical connector 1220 electrically couple channels of the pMUT array 1216 to a communication interface external to the handle portion 1214.

In embodiments, the apparatus 1200 includes a signal generating means, which may be any known in the art, coupled to the pMUT array 1216, for example by way of electrical connector 1220. The signal generating means is to provide an electrical drive signal on various drive/sense electrodes. In one specific embodiment, the signal generating means is to apply an electrical drive signal to cause the piezoelectric transducer element populations to resonate at frequencies between 100 kHz and 1 GHz, such as 1 MHz and 50 MHz. In an embodiment, the signal generating means includes a de-serializer 1204 to de-serialize control signals that are then de-multiplexed by demux 1206. The exemplary signal generating means further includes a digital-to-analog converter (DAC) 1208 to convert the digital control signals into driving voltage signals for the individual transducer element channels in the pMUT array 1216. Respective time delays can be added to the individual drive voltage signal by a programmable time-delay controller 1210 to beam steer, create the desired beam shape, focus, and direction, etc. Coupled between the pMUT channel connector 1220 and the signal generating means is a switch network 1212 to switch the pMUT array 1216 between drive and sense modes.

In embodiments, the apparatus 1200 includes a signal collecting means, which may be any known in the art, coupled to the pMUT array 1216, for example by way of electrical connector 1220. The signal collecting means is to collect an electrical sense signal from the drive/sense electrode channels in the pMUT array 1216. In one exemplary embodiment of a signal collecting means, an analog to digital converter (ADC) 1214 is to receive voltages signals and convert them to digital signals. The digital signals may then be stored to a memory (not depicted) or first passed to a signal processing means. An exemplary signal processing means includes a data compression unit 1226 to compress the digital signals. A multiplexer 1228 and a serializer 1202 may further process the received signals before relaying them to a memory, other storage, or a downstream processor, such as an image processor that is to generate a graphical display based on the received signals.

It is to be understood that the above description is intended to be illustrative, and not restrictive. For example, while flow diagrams in the figures show a particular order of operations performed by certain embodiments of the invention, it should be understood that such order is not required unless explicitly recited or implicitly required through specification of structure. Alternative embodiments may perform the operations in a different order, combine certain operations, overlap certain operations, etc. Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A micromachined ultrasonic transducer (MUT) array, comprising:
    a plurality of transducer elements disposed over an area of a first side of a substrate, each of the plurality of transducer elements including a reference electrode and a signal electrode, wherein the respective reference electrodes of the plurality of transducer elements are interconnected to each other and coupled each to a reference potential plane that is distinct from the substrate, wherein the reference potential plane is configured to provide a reference potential directly to the respective reference electrodes via a conductive path that is independent of the substrate;
    a dielectric layer disposed between the respective reference electrodes of the plurality of transducer elements and the first side of the substrate, the dielectric layer forming a hole that extends to the first side of the substrate;
    a metal-semiconductor contact formed at the hole by one of the respective reference electrodes of the plurality of transducer elements with a semiconductor layer at the first side of the substrate; and
    one or more conductive traces connecting the metal-semiconductor contact to the reference potential plane, wherein the substrate is coupled to the reference potential plane via the metal-semiconductor contact and the one or more conductive traces.

2. The MUT array of claim 1, wherein the reference electrode is disposed over a membrane of each of transducer element, wherein the signal electrode is disposed under the membrane, proximate to the semiconductor layer, and wherein the substrate is a semiconductor-on-insulator (SOI) substrate with the semiconductor layer disposed over the insulator.

3. The MUT array of claim 2, wherein the membrane is a piezoelectric material, wherein the reference electrode is in direct contact with the piezoelectric material, and wherein the conductive trace comprises metallization extending between the metal-semiconductor contact and the reference electrode.

4. The MUT array of claim 3, wherein the metal-semiconductor contact comprises an ohmic contact having a contact resistance that is lower than an impedance of parasitic capacitive loop between signal electrodes of the plurality.

5. The MUT array of claim 4, wherein the array comprises a row of the elements and wherein the metal-semiconductor contact is one of a plurality of metal-semiconductor contacts, each of which is disposed adjacent to each of the plurality of transducer elements.

6. The MUT array of claim 5, wherein the row of the elements is one of a plurality of rows in the array and wherein the metal-semiconductor contact has a length that extends across the plurality of rows.

7. The MUT array of claim 5, wherein signal electrodes of the row are addressable independently from signal electrodes of a second row, and wherein the first and second rows share a single metal-semiconductor contact at one end of the rows, or wherein a first and second metal-semiconductor contact is disposed proximate to opposite ends of the first and second rows.

8. The MUT array of claim 4, wherein the array comprises a row of the transducer elements and wherein the metal-semiconductor contact is disposed at a first end of the row and occupies a contact area at least twice that of the element membrane.

9. The MUT array of claim 4, wherein the reference electrode comprises one or more metals and wherein the metallization extending between the reference electrode and the metal-semiconductor contact comprises the same one or more metals.

10. The MUT array of claim 9, wherein the reference electrode comprises at least one of $IrO_2$, $NiO_2$, $PtO_2$, and indium tin oxide (ITO), and wherein at least one of the $IrO_2$, $NiO_2$, $PtO_2$, or ITO is disposed over the ohmic contact.

11. The MUT array of claim 10, wherein the ohmic contact comprises at least one of Pt and Ti.

12. The MUT array of claim 11, wherein the semiconductor layer is n-type or p-type doped with a dopant species concentration of at least 1e19 cm-3.

13. An apparatus for generating and sensing pressure waves in a medium, the apparatus comprising:

the MUT array of claim 1;

generating means coupled to the MUT array to apply an electrical drive signal on at least one drive/sense electrode;

receiving means coupled to the MUT array to receive an electrical response signal from at least one drive/sense electrode; and signal processing means coupled to the receiving means to process electrical response signals received from the plurality of the drive/sense electrodes.

14. The apparatus of claim 13, wherein the generating means is to apply an electrical drive signal to cause at least one of the piezoelectric transducer element populations to resonate at frequencies between 1 MHz and 50 MHz.

15. A method of fabricating a MUT array, the method comprising:

forming a dielectric layer on a substrate, wherein the dielectric layer forms a hole that extends to the first side of the substrate;

forming a plurality of transducer elements disposed over the dielectric layer and the first side of the substrate;

connecting respective first electrodes of each of the transducer elements to a common ground plane that is distinct from the substrate, wherein the common ground plane is configured to provide a reference potential directly to the respective first electrodes via a conductive path that is independent of the substrate; and forming a metal-semiconductor contact at the hole, including contacting one of the respective first electrodes with a semiconductor layer at the first side of the substrate, wherein the metal-semiconductor contact is connected to the common ground plane with a conductive interconnect trace, and wherein the substrate is coupled to the common ground plane via the metal-semiconductor contact and the conductive interconnect trace.

16. The method of claim 15, wherein forming the plurality of transducer elements further comprises:

depositing a piezoelectric material layer over a semiconductor layer of a semiconductor-on-insulator (SOI) substrate with a bottom surface of the piezoelectric material layer in contact with second electrodes; and patterning the piezoelectric material layer into a plurality of discrete piezoelectric membranes; and wherein connecting the first electrode of each of the transducer elements and the metal-semiconductor contact to the common ground plane further comprises:

depositing at least one metal layer over a top surface of the plurality of discrete piezoelectric membranes and over the metal-semiconductor contact; and patterning the at least one metal layer into the conductive interconnect trace.

17. The method of claim 16, wherein depositing the at least one metal layer further comprises depositing at least one of IrO2, NiO2, PtO2, and indium tin oxide (ITO) directly on a top surface of the piezoelectric membrane and over an ohmic metal forming the metal-semiconductor contact.

18. The method of claim 17, wherein the ohmic metal includes at least one of Pt and Ti, and wherein depositing the at least one metal layer further comprises depositing a second metal layer over the IrO2, NiO2, PtO2, or ITO, the second metal layer having greater thickness than the layer of IrO2, NiO2, PtO2, or ITO.

19. The method of claim 16, where forming the metal-semiconductor contact further comprises:

patterning a contact opening through a dielectric layer exposing a surface of the semiconductor layer; and depositing an ohmic metal in the contact opening before connecting the first electrode of each of the transducer elements to the common ground plane.

20. The method of claim 19, wherein semiconductor layer is doped to at least 1e19cm-3, wherein patterning the piezoelectric material layer into the plurality of discrete piezoelectric membranes further comprises patterning the membranes into a row; and wherein patterning the contact opening further comprises opening a single region of the dielectric disposed at an end of the row.

21. The method of claim 19, wherein patterning the piezoelectric material layer into the plurality of discrete piezoelectric membranes further comprises patterning the membranes into a row of discrete elements; and wherein patterning the contact opening further comprises opening a plurality of regions in the dielectric along a length of the row.

22. The method of claim 19, wherein forming the metal-semiconductor contact further comprises siliciding the ohmic metal.

* * * * *